US006838817B2

(12) United States Patent
Noguchi

(10) Patent No.: US 6,838,817 B2
(45) Date of Patent: Jan. 4, 2005

(54) LIGHT EMITTING DEVICE AND METHOD OF EXTRACTING LIGHT FROM LIGHT EMITTING DEVICE

(75) Inventor: Takafumi Noguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 179 days.

(21) Appl. No.: 10/342,049

(22) Filed: Jan. 15, 2003

(65) Prior Publication Data

US 2003/0137238 A1 Jul. 24, 2003

(30) Foreign Application Priority Data

Jan. 15, 2002 (JP) ........................................ 2002-005767

(51) Int. Cl.$^7$ ................................................ H01J 1/62
(52) U.S. Cl. ........................ 313/501; 313/111; 313/112; 313/506
(58) Field of Search ............................... 313/111, 112, 313/501, 506; 359/634, 359

(56) References Cited

U.S. PATENT DOCUMENTS 6,262,850 B1 * 7/2001 Krisko et al. .............. 359/634

OTHER PUBLICATIONS

"Electronic Information Communication Handbook", Ohmsha, published in 1998, Section 5, subsections 5 to 12, on the page of "Electronic Display and Printer".

T. Watanabe et al., "Optimization of emitting efficiency in organic LED cells using Ir complex", (Synthetic Metals 122 in 2001, 203–207.

* cited by examiner

Primary Examiner—Vip Patel
(74) Attorney, Agent, or Firm—Sughrue Mion, PLLC

(57) ABSTRACT

The light emitting device includes a light emitting portion having a larger refraction index than air, and a medium which is provided on a light extraction surface extracting light from the light emitting portion and which has different haze ratios depending on a light incident angle, wherein a haze ratio is defined as follows:

the haze ratio=(scattered light transmission factor/total light transmission factor)×100 (%), or =(scattered light transmission factor/(scattered light transmission factor+parallel light transmission factor))×100 (%).

The light emitting device improves the light extraction efficiency from the light emitting device.

14 Claims, 2 Drawing Sheets

LIGHT EMITTING DEVICE AND METHOD OF EXTRACTING LIGHT FROM LIGHT EMITTING DEVICE

BACKGROUND OF THE INVENTION

1. Field of the Invention

The present invention relates to an improvement on a light emitting device employing, for example, electroluminescence (EL), and a method of extracting light using the same, and more particularly to a technique for improving the efficiency of extracting light from the light emitting device.

2. Description of the Related Art

EL light emitting devices (panels) using inorganic EL, organic EL, etc. are widely used in display devices and the like. In the inorganic EL light emitting device, a light emitting layer formed of ZnS:Mn is used, and 180 to 200 V of alternating voltage is applied to a three-layer construction in which the light emitting layer is sandwiched between insulating layers formed of $SiN_x$ or the like. Concurrently, electrons collide into Mn atoms to be excited, allowing orange light to be emitted therefrom. On the other hand, the organic EL light emitting device is basically of a two-layer construction including a hole transporting layer and a light emitting layer. Electron holes injected from an anode and electrons injected from a cathode recombine in the light emitting layer, generating molecular excitons therein. Here, fluorescent is used that is generated when the excited excitons return to a ground state. Since the light emission is of a charge injection type, the organic EL light emitting device is also referred to as an organic light emitting diode.

FIG. 4 shows a basic construction of the organic EL light emitting device. The EL light emitting device shown in FIG. 4 comprises a glass substrate 12, a linear ITO transparent electrode (anode) 14, a first insulating layer 16, a hole transporting layer 18, a light emitting layer 20 capable of emitting light through electroluminescence, and a linear backside electrode (cathode) 22. Note that, the direction of viewing is from the bottom of the diagram.

In the EL light emitting device shown in FIG. 4, electrons and electron holes (positive holes) are injected from the pair of electrodes, namely the cathode 22 and the anode 14, into the light emitting layer 20. The electrons and the holes recombine in the light emitting layer 20, and when the molecules return from an excited state to a ground state, light is generated. Then, the light (normally, a portion of the light) generated in the light emitting layer 20 penetrates through the transparent anode 14 to be extracted on a light extraction side.

Note that, for the details of the EL light emitting device (panel) described above, reference may be made to "Electronic Information Communication Handbook" (Ohmsha, published in 1998) Section 5, Subsections 5 to 12, on the page of "Electronic Display and Printer", for example.

Incidentally, in the EL light emitting device having the above-mentioned construction, the light emitting layer 20 and the air have different indexes of refraction from each other. Therefore, conventionally, there is a problem that only approximately 20% of the light (luminescence) generated in the light emitting layer 20 can be extracted.

The cause of this is that, in the process of penetrating through the ITO transparent electrode 14 and the glass substrate 12, the light (luminescence) generated in the light emitting layer 20 is refracted again and again, and a total reflection occurs inside the glass substrate 12, whereby the light is often trapped therein. Specifically, when the organic layer is used as the light emitting layer 20, its refraction index is approximately 1.7, the refraction index of the glass constituting the glass substrate 12 is approximately 1.5, and the refraction index of the external air is approximately 1.0. Therefore, only the light emitted at emission angles within approximately 38° (which corresponds to a kind of critical angle) with respect to a line set perpendicular to the glass substrate 12 is extracted to the exterior.

When this is calculated in terms of solid angles, only approximately 22% out of all the generated light can be extracted. This means that approximately just under 4/5 of all the generated light is being lost without being used.

In response to this, a research group of Kyushu University and the like have attempted an experiment in which a silica aerogel layer having a refraction index of 1.03, which is close to that of air, is inserted between the glass substrate and the ITO transparent electrode to improve the light extraction rate. However, although decent results are obtained by this method, control of the thickness of the light emitting layer and other aspects require sophisticated optimization techniques for the EL light emitting device, and thus the method has a critical problem that it cannot be realized easily.

SUMMARY OF THE INVENTION

The present invention has been made in light of the above-mentioned circumstances, and therefore has an object to provide a light emitting device capable of improving the light extraction efficiency from the light emitting device.

Another object of the present invention is to provide a method of extracting light efficiently from the light emitting device.

In order to attain the above-mentioned object, the present invention provides a light emitting device, comprising:

a light emitting portion having a larger refraction index than air; and a medium which is provided on a light extraction surface extracting light from the light emitting portion and which has different haze ratios depending on a light incident angle, wherein a haze ratio is defined as follows:

the haze ratio=(scattered light transmission factor/total light transmission factor)×100(%), or =(scattered light transmission factor/(scattered light transmission factor+parallel light transmission factor))×100(%).

Preferably, the medium is a medium having layer haze ratios at larger light incident angles. In other words, it is preferable that the haze ratio of the medium is small when the light incident angle is relatively small and is large when the light incident angle is relatively large.

And, preferably, the medium is a medium having a larger haze ratio when the light incident angle exceeds the critical angle of the light emitting portion than when the light incident angle is smaller than the critical angle. In other words, it is preferable that the haze ratio of the medium is relatively small when the light incident angle is smaller than the critical angle and is relatively large when the light incident angle is larger than the critical angle.

Further, preferably, the medium is a medium in which a difference of haze ratios at different light incident angles is not less than 50%. In other words, it is preferable that the medium has a difference of not less than 50% between the raze ratio when the light incident angle is relatively small and the raze ratio when the light incident angle is relatively large.

Preferably, the light emitting portion includes a light emitting layer is capable of emitting light through electroluminescence.

And, preferably, the light emitting layer is a light emitting layer of an organic EL light emitting device.

And, preferably, the organic EL light emitting device comprises, from a side of the light extraction surface, a glass substrate, a transparent electrode, the light emitting layer and a backside electrode.

Furthermore, in order to attain the above-mentioned object, the present invention provides a method of extracting light from a light emitting device whose light emitting portion has a larger refraction index than air, comprising the steps of:

scattering light emitted from the light emitting portion at an angle exceeding a critical angle of the light emitting portion by a medium provided on a light extraction surface side of the light emitting device and having different haze ratios depending on a light incident angle; and extracting a portion of the scattered light together with light emitted from the light emitting portion at a smaller angle than the critical angle, wherein a haze ratio is defined as follows:

the haze ratio=(scattered light transmission factor/total light transmission factor)×100(%), or =(scattered light transmission factor/(scattered light transmission factor+parallel light transmission factor))×100(%).

Preferably, the medium is a medium having larger haze ratios at larger light incident angles. In other words, it is preferable to use the medium whose haze ratio is small when the light incident angle is relatively small and is large when the light incident angle is relatively large.

Preferably, the medium is a medium having a larger haze ratio when the light incident angle exceeds the critical angle of the light emitting portion than when the light incident angle is smaller than the critical angle, that is, it is preferable to use the medium whose haze ratio is relatively small when the light incident angle is smaller than the critical angle and is relatively large when the light incident angle is larger than the critical angle.

In addition, preferably, the medium is a medium in which a difference of haze ratios at different light incident angles is not less than 50%, that is, it is preferable to use the medium which has a difference of not less than 50% between the raze ratio when the light incident angle is relatively small and the raze ratio when the light incident angle is relatively large.

Preferably, the light emitting portion includes a light emitting layer is capable of emitting light through electroluminescence.

And, preferably, the light emitting layer is a light emitting layer of an organic EL light emitting device.

And, preferably, the organic EL light emitting device comprises, from a side of the light extraction surface, a glass substrate, a transparent electrode, the light emitting layer and a backside of electrode.

DETAILED DESCRIPTION OF THE PREFERRED EMBODIMENT

Hereinafter, the light emitting device and the method of extracting light from the light emitting device are described in detail with reference to the preferred embodiment shown in the accompanying drawings, but before that, a simple explanation will be made regarding principles of the present invention.

In accordance with the present invention, on a light extraction surface side of a light emitting device whose light emitting portion has a larger refraction index than air, there is mounted a medium which exhibits different haze ratios depending on a light incident angle. As a result, the light emitted at or above the above-mentioned critical angle is scattered by the above-mentioned medium. Therefore, a portion thereof which becomes incident light from within the range defined by the critical angle can be extracted together with the light initially emitted at a smaller angle than the critical angle, thereby accordingly improving the light extraction efficiency.

It should be noted here that the haze ratio is defined as follows:

Haze ratio=(scattered light transmission factor/total light transmission factor)×100(%)=(scattered light transmission factor/(scattered light transmission factor+parallel light transmission factor))×100 (%)

A view control film "Lumisty" available from Sumitomo Chemical Co., Ltd. can be suitably used as the medium described above. This view control film includes a variety of products having different view control properties. Then, it is preferable to select and use the one exhibiting a large haze ratio in the range exceeding the above-described critical angle (about 38°) from among these products.

Hereinafter, the explanation of the embodiment will be given.

Figure 1:
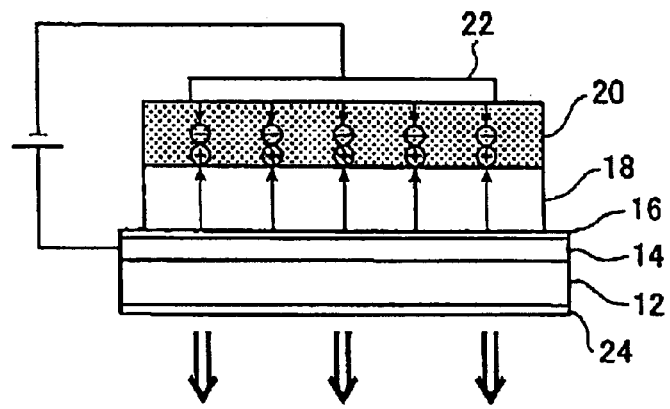
FIG. 1 is a diagram showing a construction of an EL light emitting device according to an embodiment of the present invention.

FIG. 1 is a diagram showing a construction of an EL light emitting device according to an embodiment of the present invention.

An organic EL light emitting device of the present invention shown in FIG. 1 comprises, from the light extraction surface side, a view control film 24, a glass substrate 12, a linear ITO transparent electrode (anode) 14, a first insulating layer 16, a hole transporting layer 18, a light emitting layer 20 capable of emitting light through electroluminescence, and a linear backside electrode (cathode) 22. The organic EL light emitting device shown in FIG. 1 has a similar configuration to the organic EL light emitting device shown in FIG. 4 except the view control film 24. It should be noted here that the light emitting portion in the EL light emitting device of the present invention contains at least the light emitting layer 20.

Figure 4:
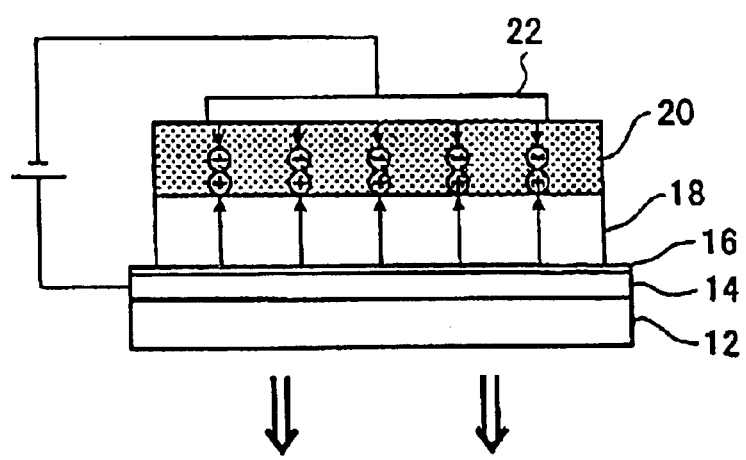
FIG. 4 is a diagram showing a common construction of a conventional EL light emitting device.

That is, a difference from the conventional EL light emitting device shown in FIG. 4 is that in the EL light emitting device according to the embodiment, the view control film 24 is mounted on the light extraction surface side (light emitting side) of the glass substrate 12.

The difference will be mainly described below. Note that the view control film 24 used as an example is "Lumisty", MFZ2555-type manufactured by Sumitomo Chemical Co., Ltd.

Figure 2:
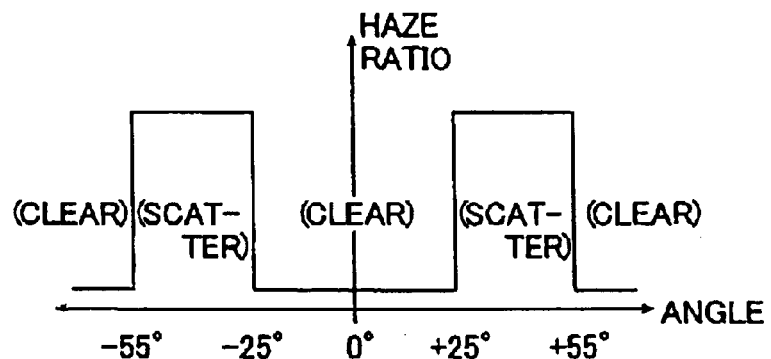
FIG. 2 is a diagram showing optical properties (view control properties) of a view control film used in the EL light emitting device according to the embodiment under consideration.

The MFZ2555-type view control film has optical properties as shown in FIG. 2. Namely, the view control properties of the MFZ2555-type film enables penetration of substantially all light beams entering at incident angles of not more than ±25° or not less than ±55° in terms of absolute values with respect to a direction perpendicular to the light emitting surface, while scattering approximately 90% of light entering at incident angles between −55° and −25° or +25° and +55°.

When this is expressed using the above-mentioned haze ratio, the light beam entering at an incident angle of not more than ±25° or not less than ±55° in terms of absolute values with respect to the direction perpendicular to the light emitting surface of the EL light-emitting device has a haze ratio of 10% or less, and the light entering at an incident angle between −55° and −25° or +25° and +55° has a haze ratio of approximately 80%.

The emmission brightness of the EL light emitting device according to the embodiment constructed by applying the view control film having the above-mentioned optical properties, and the emission brightness of a conventional common EL light emitting device in which the above-mentioned view control film is not applied, were measured for each light emission in total ten times, and the results are shown in Table 1.

TABLE 1

| Number of light emissions | With view control film | Without view control film |
| --- | --- | --- |
| 1 | 109 | 115 |
| 2 | 111 | 116 |
| 3 | 111 | 125 |
| 4 | 114 | 123 |
| 5 | 111 | 123 |
| 6 | 114 | 120 |
| 7 | 113 | 123 |
| 8 | 113 | 123 |
| 9 | 117 | 122 |
| 10 | 114 | 124 |

As shown in Table 1, in view of the average brightness of the 10 light emissions, there is an approximately 8% difference between the emission brightness of the EL light emitting device according to the embodiment constructed by having the view control film 24 with the above-mentioned optical properties and the conventional EL light emitting device in which the view control film is not applied. Thus, it is understood that the EL light emitting device according to this embodiment improves the efficiency of extracting light from the EL light emitting device.

This difference would not be so great in numeric value, but it does clarify one direction for improving the efficiency of extracting light from the EL light emitting device, and this profound difference should be appreciated. That is, it has been conventionally difficult to extract about 80% of the light generated inside the EL light emitting device to the exterior due to absorption or other reasons. The present invention can provide a markedly significant result in that at least a portion thereof can be extracted to the exterior.

This result shows that the view control film used as the medium in the present invention is preferably a view control film (medium) having larger haze ratios at larger light incident angles, in other words, the one whose haze ratio is small when the light incident angle is relatively small and is large when the light incident angle is relatively large.

The view control film used as the medium is preferably a medium having a larger haze ratio when the light incident angle exceeds the critical angle (of the light emitting portion) than when the light incident angle is smaller than the critical angle, in other words, a medium whose haze ratio is relatively small when the light incident angle is smaller than the critical angle and is relatively large when the light incident angle is larger than the critical angle.

Further, the view control film used as the medium is preferably a medium in which the haze ratio at a light incident angle differs from the haze ratio at another light incident angle by 50% or more, in other words, a medium which has a difference of not less than 50% between the raze ratio when the light incident angle is relatively small and the raze ratio when the light incident angle is relatively large.

Figure 3:
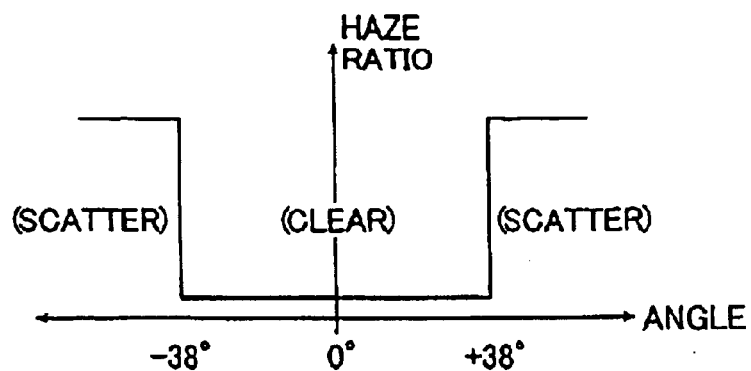
FIG. 3 is a diagram showing another example of view control properties of the view control film.

Use of a view control film having more excellent optical properties, namely view control properties than the view control film according to this embodiment may further enhance the light extraction efficiency from the EL light emitting device. Specifically, by utilizing for example such a view control film that an even greater portion of the light emitted at an angle exceeding the critical angle (38°) can be scattered (for example by utilizing a view control film having such view control properties as shown in FIG. 3), the light emitting at an angle smaller than the above-mentioned critical angle is increased, which enables further improvement of the efficiency of the light extraction from the EL light emitting device.

The optical properties of the view control film used in this embodiment are only controlled along a linear boundary in a plane. However, more efficient light extraction from the EL light emitting device is clearly possible by combining this control along the linear boundary with another control performed along a boundary in a direction perpendicular thereto, or by adopting an improved control performed along a concentric boundary around a given point.

In the above-mentioned embodiment, the view control film 24 is mounted on the light extraction surface side of the glass substrate 12. This is not however the sole case of the present invention and the view control film 24 may be used for the light extraction surface instead of the glass substrate 12. It should be noted here that the light emitting device used in the present invention is not particularly limited to the organic EL light emitting device as long as the light emitting device used has a light emitting portion whose refraction index is larger than air.

Note that, the above-mentioned embodiment is one example of the present invention, and the present invention is not limited to this embodiment. It goes without saying that appropriate alterations and improvements can be made without departing from the essence of the present invention.

As described in detail above, according to the present invention, it is possible to provide a light emitting device in which the efficiency of extracting light from the light emitting device can be improved, and a method of efficiently extracting light from the light emitting device.

In other words, in the light emitting device according to the present invention, by mounting on or otherwise adding to the light extraction surface the medium which has different haze ratios depending on the light incident angle, the light which cannot be extracted due to the total internal reflection at the air boundary can be partially extracted after the light has been scattered once.

Similarly, in the method of extracting light from a light emitting device according to the present invention, light is scattered on the light extraction surface to enable extraction of a portion of the light, whereby the amount of light extracted from the light emitting device can be increased.

What is claimed is:

1. A light emitting device, comprising:

a light emitting portion having a larger refraction index than air; and a medium which is provided on a light extraction surface extracting light from said light emitting portion and which has different haze ratios depending on a light incident angle, wherein a haze ratio is defined as follows:

the haze ratio=(scattered light transmission factor/total light transmission factor)×100(%), or =(scattered light transmission factor/(scattered light transmission factor+parallel light transmission factor))×100(%).

2. The light emitting device according to claim 1, wherein said medium is a medium having layer haze ratios at larger light incident angles.

3. The light emitting device according to claim 1, said medium is a medium having a larger haze ratio when said light incident angle exceeds the critical angle of said light emitting portion than when said light incident angle is smaller than the critical angle.

4. The light emitting device according to claim 1, said medium is a medium in which a difference of haze ratios at different light incident angles is not less than 50%.

5. The light emitting device according to claim 1, said light emitting portion includes a light emitting layer is capable of emitting light through electroluminescence.

6. The light emitting device according to claim 5, wherein said light emitting layer is a light emitting layer of an organic EL light emitting device.

7. The light emitting device according to claim 6, said organic EL light emitting device comprises, from a side of said light extraction surface, a glass substrate, a transparent electrode, said light emitting layer and a backside electrode.

8. A method of extracting light from a light emitting device whose light emitting portion has a larger refraction index than air, comprising the steps of:

scattering light emitted from said light emitting portion at an angle exceeding a critical angle of said light emitting portion by a medium provided on a light extraction surface side of said light emitting device and having different haze ratios depending on a light incident angle; and extracting a portion of said scattered light together with light emitted from said light emitting portion at a smaller angle than said critical angle, wherein a haze ratio is defined as follows:

the haze ratio=(scattered light transmission factor/total light transmission factor)×100(%), or =(scattered light transmission factor/(scattered light transmission factor+parallel light transmission factor))×100(%).

9. The method according to claim 8, wherein said medium is a medium having larger haze ratios at larger light incident angles.

10. The method according to claim 8, said medium is a medium having a larger haze ratio when said light incident angle exceeds the critical angle of said light emitting portion than when said light incident angle is smaller than the critical angle.

11. The method according to claim 8, said medium is a medium in which a difference of haze ratios at different light incident angles is not less than 50%.

12. The method according to claim 8, said light emitting portion includes a light emitting layer is capable of emitting light through electroluminescence.

13. The method according claim 12, wherein said light emitting layer is a light emitting layer of an organic EL light emitting device.

14. The method according claim 13, said organic EL light emitting device comprises, from a side of said light extraction surface, a glass substrate, a transparent electrode, said light emitting layer and a backside of electrode.

* * * * *